March 11, 1969 A. L. ZAVITZ 3,432,423
ELECTROPLATING APPARATUS
Filed Oct. 7, 1966

INVENTOR.
ARNOLD L. ZAVITZ,
By L E Carnahan
AGENT.

United States Patent Office 3,432,423
Patented Mar. 11, 1969

3,432,423

ELECTROPLATING APPARATUS

Arnold L. Zavitz, Upland, Calif., assignor to General Dynamics Corporation, a corporation of Delaware
Filed Oct. 7, 1966, Ser. No. 585,005
U.S. Cl. 204—297 6 Claims
Int. Cl. C23b *5/70*

This invention relates to electroplating apparatus and more particularly to an electrical contact plate assembly for holding articles to be electroplated.

With the advent of printed circuit assemblies, much effort has been directed to providing devices for holding circuits to be plated without interference with the plating process. The use of flexible type harnesses, for example, having various circuits thereon necessitate the need for holding devices which will provide electrical contact with the circuits to be plated while being immersed in the chemical plating bath. The present invention provides a holding device for circuits to be plated without producing any adverse effect on the plating process.

Therefore, it is an object of this invention to provide a simple and efficient device for holding articles during electroplating processes.

A further object of the invention is to provide an electrical contact plate assembly capable of making electrical contact with circuits to be plated while holding same immersed in a chemical plating bath.

Another object of the invention is to provide an electrical contact plate assembly for holding circuits to be plated in a chemical plating bath without producing any adverse effects on the plating process.

Another object of the invention is to provide an electrical contact plate assembly for holding circuits to be electroplated which includes a contact plate with at least one dimpled contact finger, the plate being insulated and retained via non-metallic plate members.

Other objects of the invention, not specifically set forth above, will become readily apparent from the following written description and accompanying drawings wherein.

Figures 1, 2, 3:
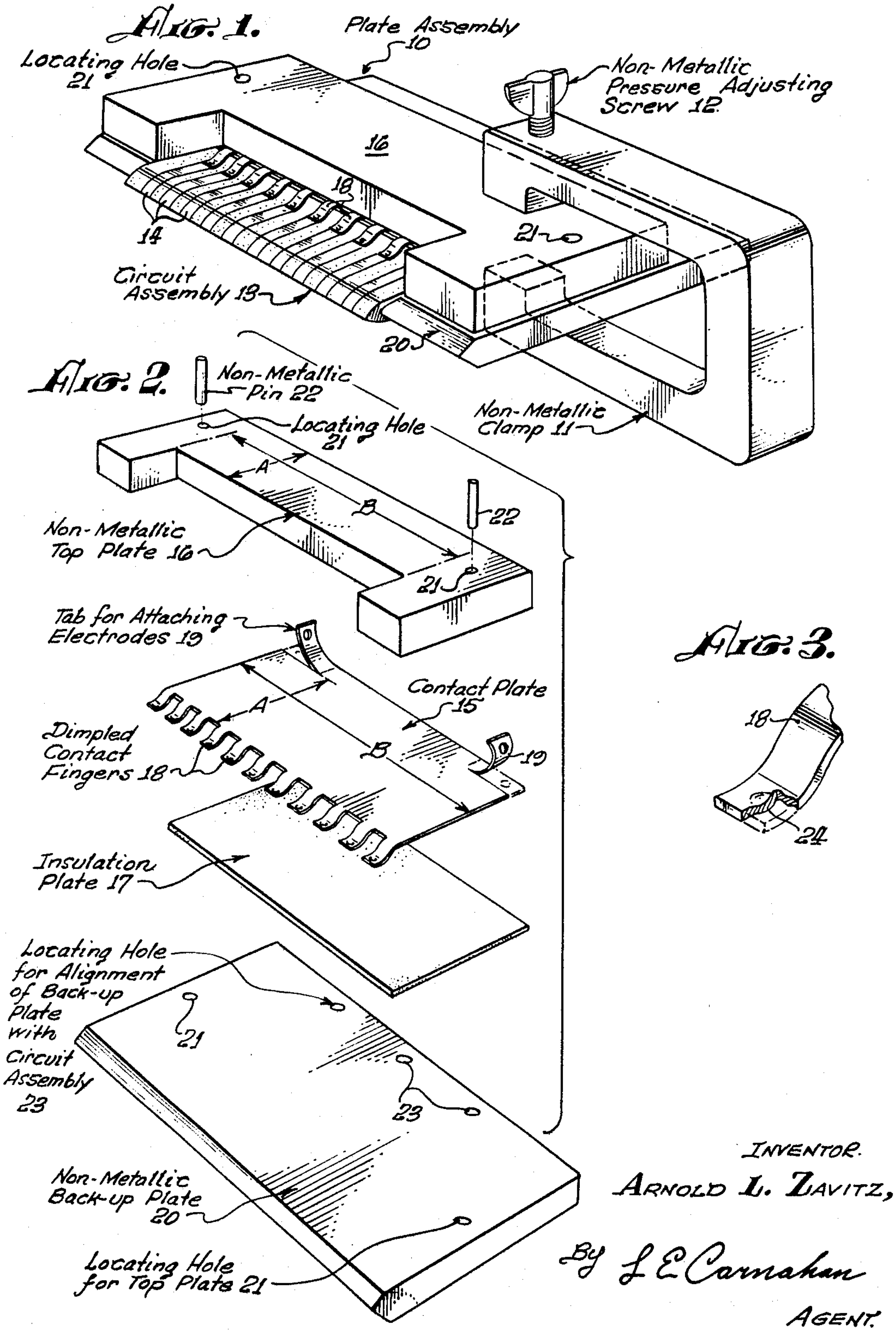
FIG. 1 is a perspective view of an embodiment of the invention positioned for plating operations.
FIG. 2 is an exploded view illustrating the plate arrangement of the FIG. 1 device.
FIG. 3 is an enlarged cross-sectional view of a finger element of the FIG. 1 device.

Broadly, the invention relates to an electrical contact assembly for use in connection with a chemical plating process involving the plating of multi-circuit printed circuit cards, flexible harnesses, etc. The illustrated configuration essentially comprises non-metallic upper and lower plates between which are sandwiched an insulation plate and a contact plate carrying a multiplicity of spring finger contacts (one finger for each circuit of the card, harness, etc. to be plated), the arrangement being such that each of the fingers, which are dimpled to reduce contact area, functions to positively hold the printed circuit card workpiece in place and also to individually connect each of the circuits to the source of energizing potential.

Referring now to the drawings, the embodiment illustrated in FIG. 1 comprises an assembly of various plate members, indicated generally at 10 and illustrated in detail in FIG. 2, the plate assembly 10 being clamped together by a non-metallic clamp assembly 11 having a non-metallic pressure adjusting screw 12. The plate members of plate assembly 10 serve to retain a circuit assembly 13, in this embodiment, a flexible circuit harness, having circuit paths 14 thereon which are to be electroplated with suitable material by a chemical plating process which does not constitute part of this invention and thus a description and illustration thereof is deemed unnecessary.

The electrical contact plate assembly indicated generally at 10 in FIG. 1 is composed of two sections, a top plate sub-assembly and a backup plate. The top plate sub-assembly as seen in FIG. 2 consists of a phosphorous bronze or stainless steel contact member or plate 15 sandwiched between a top non-metallic member or plate 16 and an insulation member or plate 17 as shown in FIG. 2. The contact plate 15 has a multiplicity of serrated formed resilient contact members or fingers 18 and a pair of electrode attaching tabs 19. The number and location of resilient contact fingers 18 is dependent on the design of the circuit assembly 13 and location of the circuit paths 14 to be plated. The contact plate 15 has a width A, extending between contact fingers 18 and tabs 19, which is the same as with width indicated by A of the portion of top plate 16. The length B of plate 15 is substantially the same length as that portion of plate 16 indicated at B. It is thus seen that the tabs 19 of contact plate 15 are located at the back of top plate 16. The insulation plate 17 may be the same size as contact plate 15 defined by width A and length B or it may extend under tabs 19 and may have a slightly longer length than plate 15, if desired. The top plate sub-assembly (plates 15, 16 and 17) is positioned on a backup member or plate 20 via locating holes 21 in plates 16 and 20 by non-metallic pins 22. The circuit assembly 13 to be plated is positioned on the backup plate 20 and aligned therewith by locating holes 23, assembly 13 having similarly located holes as those in plate 20. The contact plate 15 is positioned on circuit assembly 13 such that the contact fingers 18 are located on each of the circuit paths 14 such that all circuits, functional or dummy, are energized by a suitable power source (not shown) via tabs 19 while immersed in a chemical plate bath (not shown). With the plates 15, 16, 17 and 20 properly aligned with circuit assembly 13, non-metallic clamp 11 is positioned thereover and the clamping pressure adjusted by screw 12, as shown in FIG. 1. The non-metallic structure of the electrical contact assembly (plate assembly 10 and clamp 11) will not contaminate the chemical plating bath.

As more readily seen in FIG. 3, the resilient contact fingers 18 are dimpled at 24 to provide a reduced contact area between finger 18 and circuit path 14.

The plate assembly 10 is so constructed that the contact plate 15 can be readily interchanged with another contact plate having a different number and/or location of contact fingers 18, thus providing for utilization of the invention for various types and designs of circuit assemblies 13.

If desired the top plate sub-assembly (plates 15, 16 and 17) may be removably secured together or utilized separately. Securing this subassembly together facilitates the operation of changing circuit assemblies 13 of the same design. In addition the clamp 11 may be replaced by other suitable means for securing the plates of the plate assembly 10 together.

It has thus been shown that this invention provides an assembly for holding articles to be electroplated, particularly circuit assemblies.

While a particular embodiment of the invention has been illustrated and described, modifications will become apparent to those skilled in the art, and it is intended to cover in the appended claims all such modifications as come within the true spirit and scope of the invention.

What I claim is:

1. An assembly for holding circuit assemblies and the like to be immersed in a chemical plating bath comprising: a non-metallic upper plate-like member, a contact plate-like member, an insulation plate-like member, and a non-metallic backup plate-like member, said contact plate-like member being located intermediate said upper plate-like member and said insulation plate-like member, said insulation plate-like member being located adjacent said backup plate-like member, said contact plate-like member being provided with means adapted for interconnecting same with an associated electrical power source and provided with at least one resilient finger-like member adapted to contact an associated circuit to be plated, means for aligning said plate-like members, means adapted for aligning said backup plate-like member and an associated circuit to be plated, and non-metallic means for releasably securing said plate-like members with respect to one another.

2. The assembly defined in claim 1, wherein said non-metallic upper plate-like member includes a center portion having a smaller cross-section than the cross-section of the end portions thereof, said contact plate-like member including a body portion of substantially the same size as said center portion of said upper plate-like member, said interconnecting means and said at least one finger-like member being located on the opposite sides of said body portion of said contact plate-like member, said interconnecting means and said finger-like member being located on opposite side of said center portion of said upper plate-like member when said plate-like members are assembled together.

3. The assembly defined in claim 1, wherein said means for aligning said plate-like members includes a plurality of aligned apertures in each of said upper and backup plate-like members and non-metallic pin means removably inserted in said aligned apertures.

4. The assembly defined in claim 1, wherein said means for aligning said backup plate-like member with an associated circuit to be plated includes a plurality of locating holes which are adapted to correspond with at least certain of locating holes in an associated circuit.

5. The assembly defined in claim 1, wherein said finger-like member includes a dimpled portion adapted to reduce the contact area between said finger-like member and an associated circuit to be plated.

6. The assembly defined in claim 1, wherein said non-metallic releasably securing means comprises a clamp-like member, said clamp-like member including a pressure adjusting member adapted for releasably securing said plate-like members with respect to one another and to an associated circuit assembly to be plated.

References Cited

UNITED STATES PATENTS

| | | | |
|---|---|---|---|
| 2,197,632 | 4/1940 | Dowling et al. | 204—15 |
| 2,362,228 | 11/1944 | Wright | 204—297 XR |
| 3,043,767 | 7/1962 | Tobey | 204—297 |

JOHN H. MACK, *Primary Examiner.*

D. R. JORDAN, *Assistant Examiner.*

U.S. Cl. X.R.

204—286